(12) United States Patent
Murakami

(10) Patent No.: US 6,604,662 B2
(45) Date of Patent: Aug. 12, 2003

(54) TENSION APPARATUS IN CONTINUOUS PRINTING AND MOUNTING APPARATUS FOR FILM-LIKE PRINTING BODY

(75) Inventor: Takehiko Murakami, Fuchu (JP)

(73) Assignee: Minami Co., Ltd., Tokyo (JP)

( * ) Notice: Subject to any disclaimer, the term of this patent is extended or adjusted under 35 U.S.C. 154(b) by 0 days.

(21) Appl. No.: 10/229,769

(22) Filed: Aug. 28, 2002

(65) Prior Publication Data

US 2003/0052149 A1 Mar. 20, 2003

(30) Foreign Application Priority Data

Sep. 17, 2001 (JP) ........................ 2001-281023

(51) Int. Cl.$^7$ ............................................. B65H 20/00
(52) U.S. Cl. ........................................ 226/143; 226/128
(58) Field of Search ................................. 226/128, 143

(56) References Cited

U.S. PATENT DOCUMENTS

| 4,475,678 A | * 10/1984 | Katoh | 226/143 |
| 5,839,637 A | * 11/1998 | Kanai | 226/128 |
| 5,957,360 A | * 9/1999 | Helinski et al. | 226/147 |
| 6,179,191 B1 | * 1/2001 | Chopp | 226/166 |

* cited by examiner

*Primary Examiner*—Kathy Matecki
*Assistant Examiner*—Evan H Langdon
(74) *Attorney, Agent, or Firm*—R. Neil Sudol; Henry D. Coleman; William J. Sapone

(57) ABSTRACT

A suitable tension is applied to a film-like printing body to be processed in a printing step or a parts mounting step. Further, the processed film-like printing body is automatically fed out by a predetermined stroke. In a state of a film-like printing body (9) being clamped by all the fixing clamps (19, 19, 29, 29), a tension clamp (12) in a rear side of a parts mounting apparatus (33) in a moving direction of the film-like printing body (9) is moved forward by a cylinder (17) while being kept open. Then, tension clamp (12) is pulled back by an operation of a tension coil spring (18) while the film-like printing body (9) being kept clamped. After mounting of the parts, the tension clamp (12) is opened. Next, the film-like printing body (9) is clamped by feeding clamps (20, 20), and at the same time, all of the fixing clamps (19, 19, 29, 29) are opened. Then, the feeding clamps (20, 20) are moved by a predetermined stroke in a feeding direction, and then, the film-like printing body (9) is clamped by all of the fixing clamps (19, 19, 29, 29). Thereafter, the feeding clamps (20, 20) are opened and returned.

3 Claims, 6 Drawing Sheets

TENSION APPARATUS IN CONTINUOUS PRINTING AND MOUNTING APPARATUS FOR FILM-LIKE PRINTING BODY

BACKGROUND OF THE INVENTION

1. Field of the Invention

The present invention relates to a tension apparatus in a continuous printing and mounting apparatus for a film-like printing body which executes a printing operation applied to a film-like printing body and a mounting operation of parts in accordance with a continuous process.

2. Conventional Art

In a conventional continuous printing and mounting apparatus for a film-like printing body which executes a printing operation applied to a film-like printing body and a mounting operation of parts, there is not provided a tensioning means for applying a tension to the film-like printing body in each of the processing steps, for example, a parts mounting step.

Accordingly, at a time of mounting the parts on the film-like printing body, the film-like printing body is swung so as to cause an incomplete connection, and tends to be shifted from a regular position. Further, the parts come in contact with each other, whereby the parts which have been once connected come off.

SUMMARY OF THE INVENTION

The present invention is made by taking the points mentioned above into consideration, and an object of the present invention is to provide a tension apparatus in a continuous printing and mounting apparatus for a film-like printing body which applies a suitable tension to a film-like printing body to be processed in a printing step or a parts mounting step, thereby solving the conventional problems, and can automatically feed out the processed film-like printing body by a predetermined stroke.

Then, in accordance with an aspect of the present invention, there is provided a tension apparatus in a continuous printing and mounting apparatus for a film-like printing body constituted by a pair of tension apparatuses, each of the tension apparatus comprising:

a frame-like supporting table which is mounted to an upper portion of a base table so as to move upward and downward at a suitable timing;

a tension clamp which is a ranged in a front end side in a moving direction of the film-like printing body on an upper surface of the frame-like supporting table, is mounted so as to move along the moving direction of the film-like printing body, and clamps both end portions of the film-like printing body in a width direction at a suitable timing;

a suitable pushing means for pushing the tension clamp to a front side in the moving direction of the film-like printing body by a predetermined stroke;

a tension coil spring which energizes the tension clamp pushed by a cylinder in a direction of pulling back the tension clamp and has a suitable elasticity;

a fixing clamp which is arranged in a rear side of the tension clamp in the moving direction of the film-like printing body on the upper surface of the frame-like supporting table so as to be close to the tension clamp and clamps both end portions of the film-like printing body in the width direction at a suitable timing;

a feeding clamp which is arranged in a rear end side in the moving direction of the film-like printing body on the upper surface of the frame-like supporting table, is mounted so as to move along the moving direction of the film-like printing body, clamps both end portions of the film-like printing body in the width direction at a suitable timing, and feeds out the processed film-like printing body by a predetermined stroke;

a suitable moving means for moving the feeding clamp at a predetermined timing, in a predetermined direction, and by a predetermined stroke along the moving direction of the film-like printing body; and a fixing clamp which is arranged in a rear side of the feeding clamp in the moving direction of the film-like printing body on the upper surface of the frame-like supporting table so as to be close to the feeding clamp, and clamps both end portions of the film-like printing body in the width direction at a suitable timing.

Further, in the structure mentioned above, as the pushing means for the tension clamp, it is desirable to employ a cylinder which is fixed to the frame-like supporting table along the moving direction of the film-like printing body.

Further, in the structure mentioned above, as the moving means for the feeding clamp, it is desirable to employ a moving means constituted by a screw shaft which is arranged along the moving direction of the film-like printing body, a connection plate which is connected to a supporting body of the feeding clamp provided with a screw hole engaging with the screw shaft, and a drive motor which is fixed to the frame-like supporting table and connected to the screw shaft.

DESCRIPTION OF THE PREFERRED EMBODIMENT

A description will be given below of an embodiment in accordance with the present invention with reference to the accompanying drawings.

Figure 1:
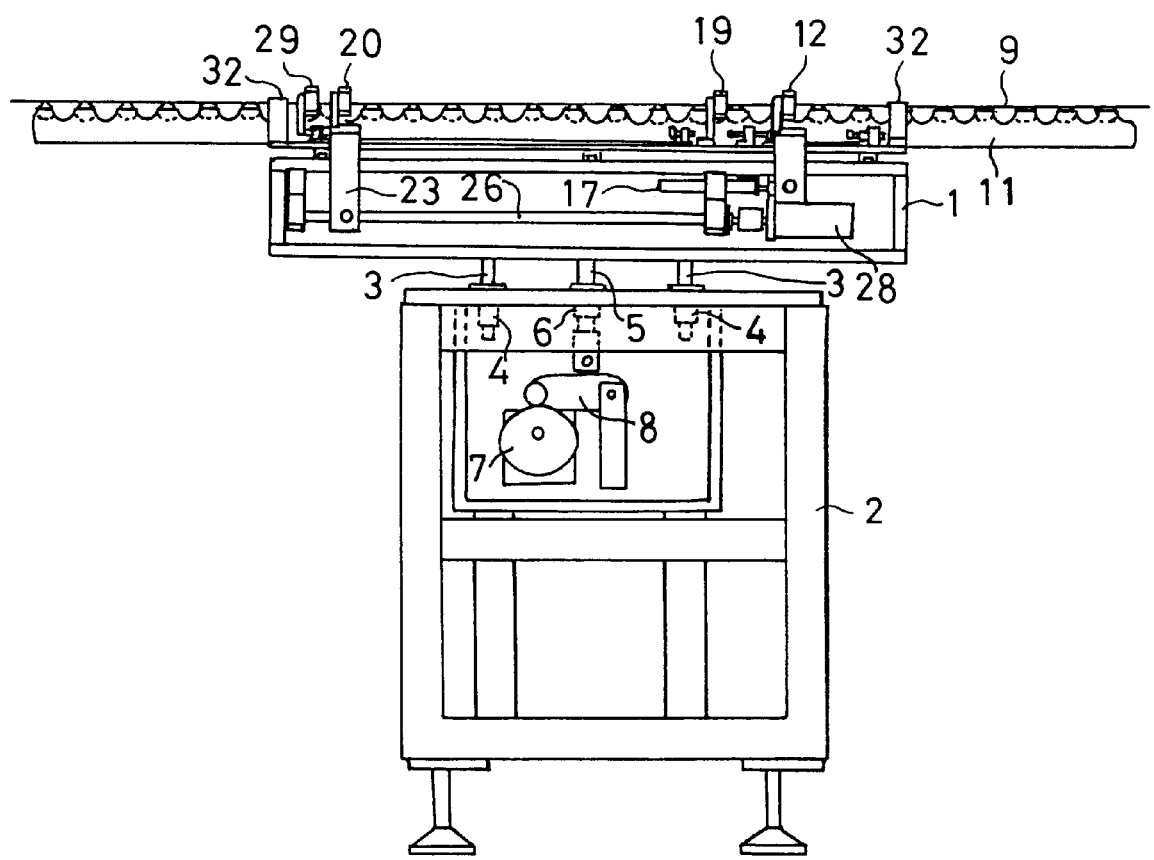
FIG. 1 is a front view of the present invention.
Figure 2:
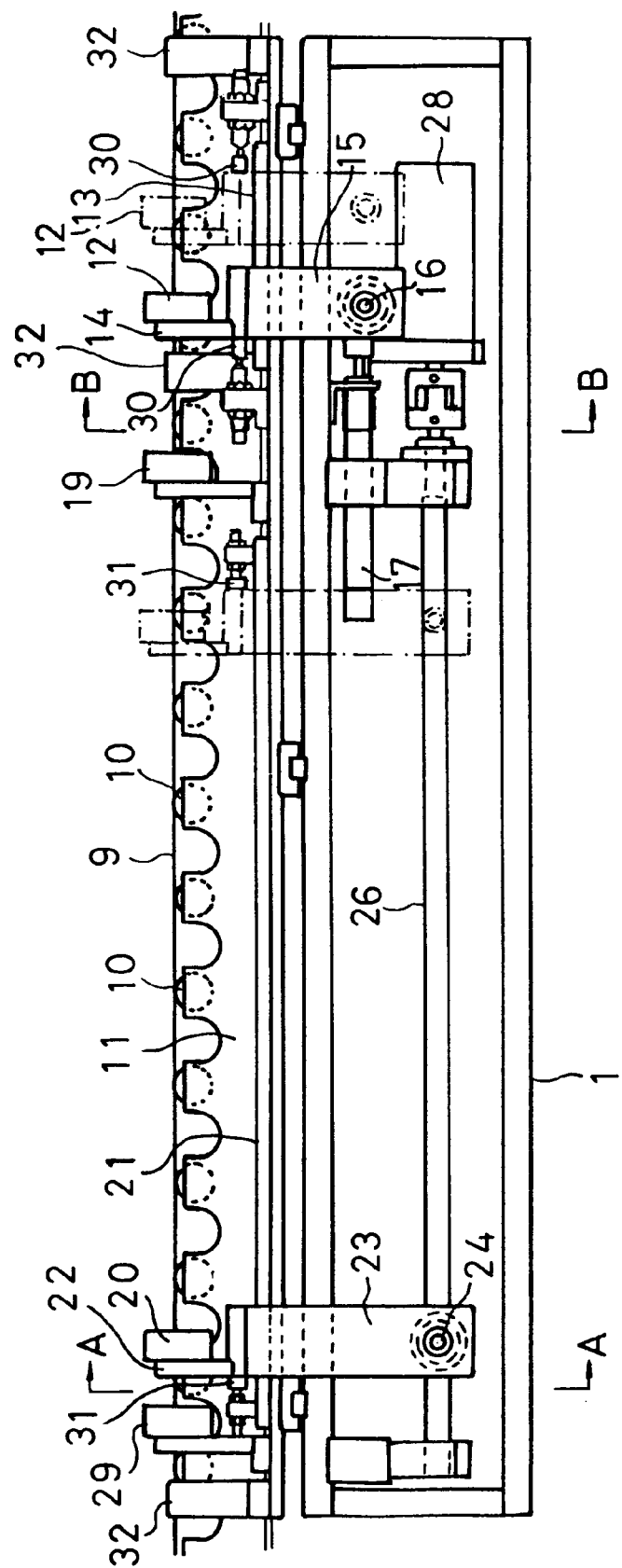
FIG. 2 is a front view of a main portion of the present invention in a partly omitting manner.
Figure 3:
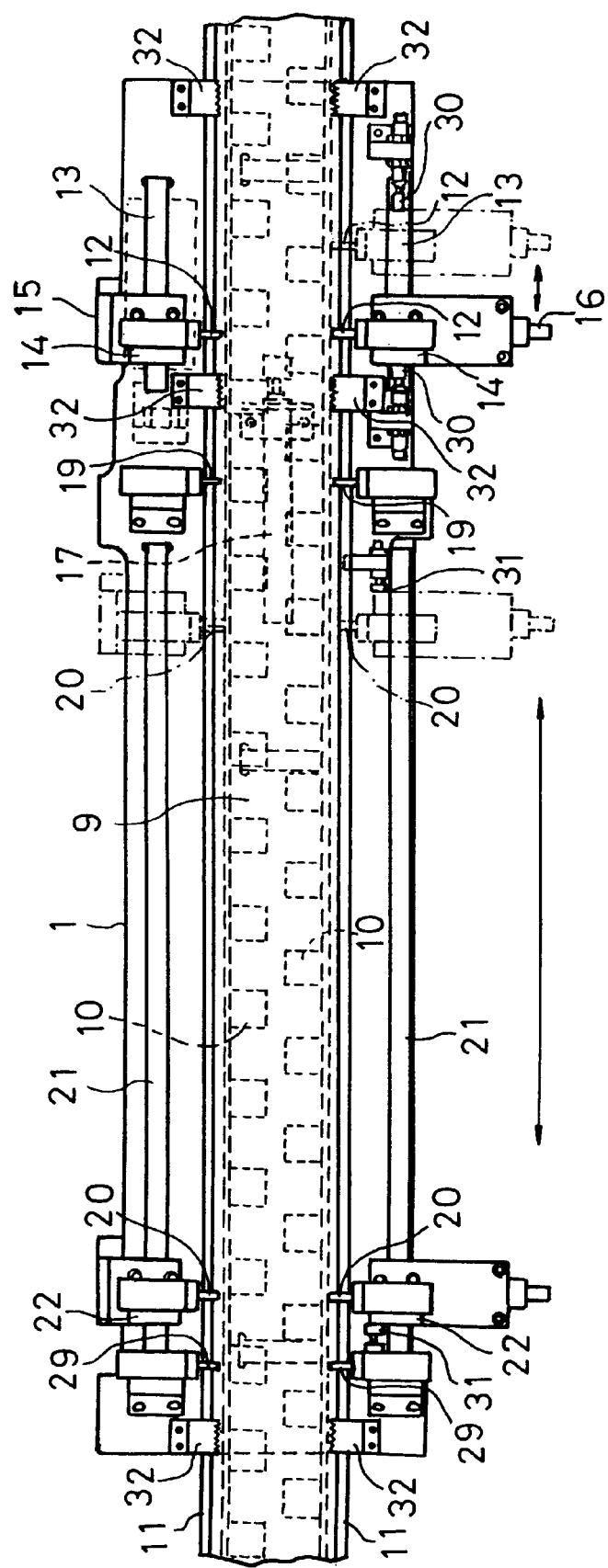
FIG. 3 is a plan view of a main portion of the present invention in a partly omitting manner.
Figure 4:
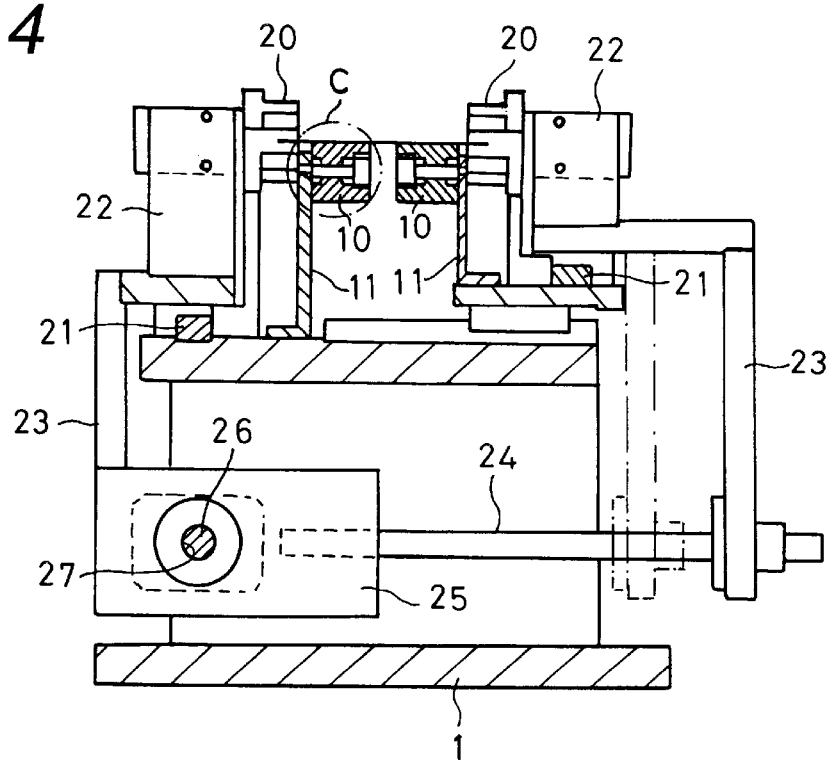
FIG. 4 is an enlarged cross sectional view along a line A—A in FIG. 2.
Figure 5:
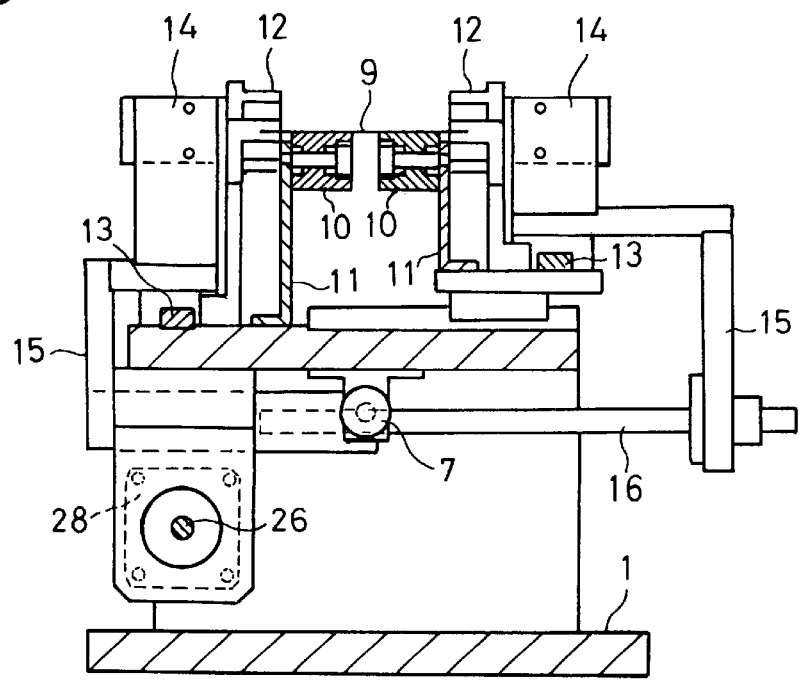
FIG. 5 is an enlarged cross sectional view along a line B—B in FIG. 2.
Figure 6:
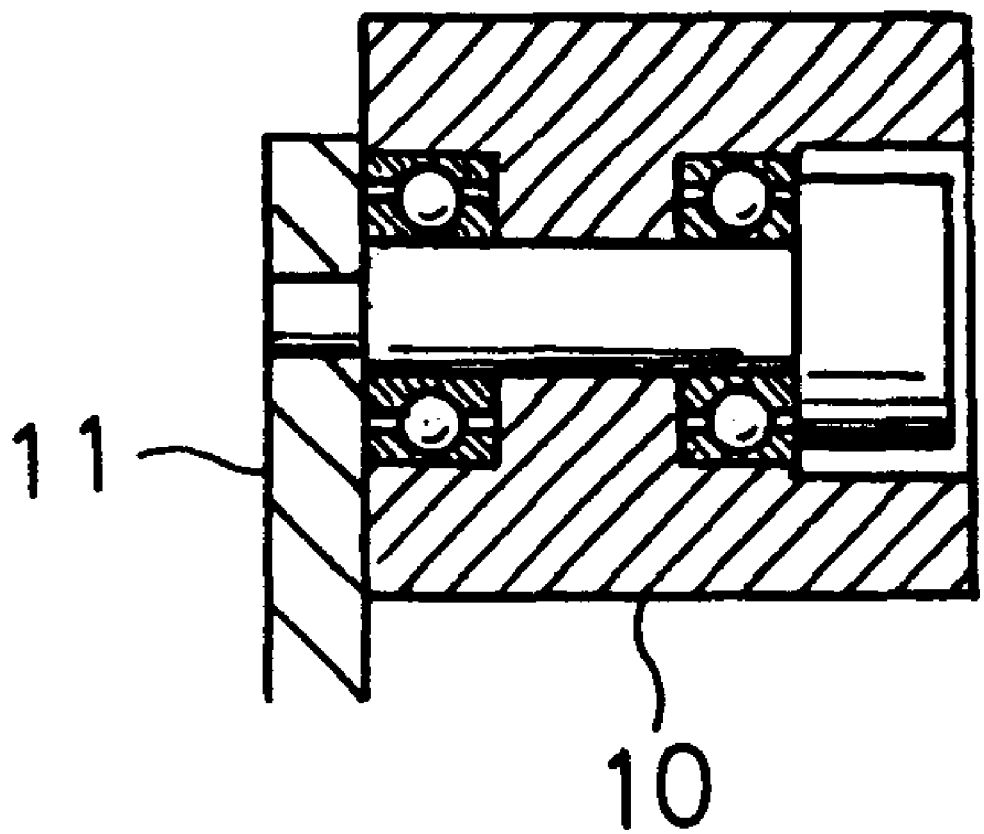
FIG. 6 is an enlarged view of a portion C in FIG. 4.
Figure 7:
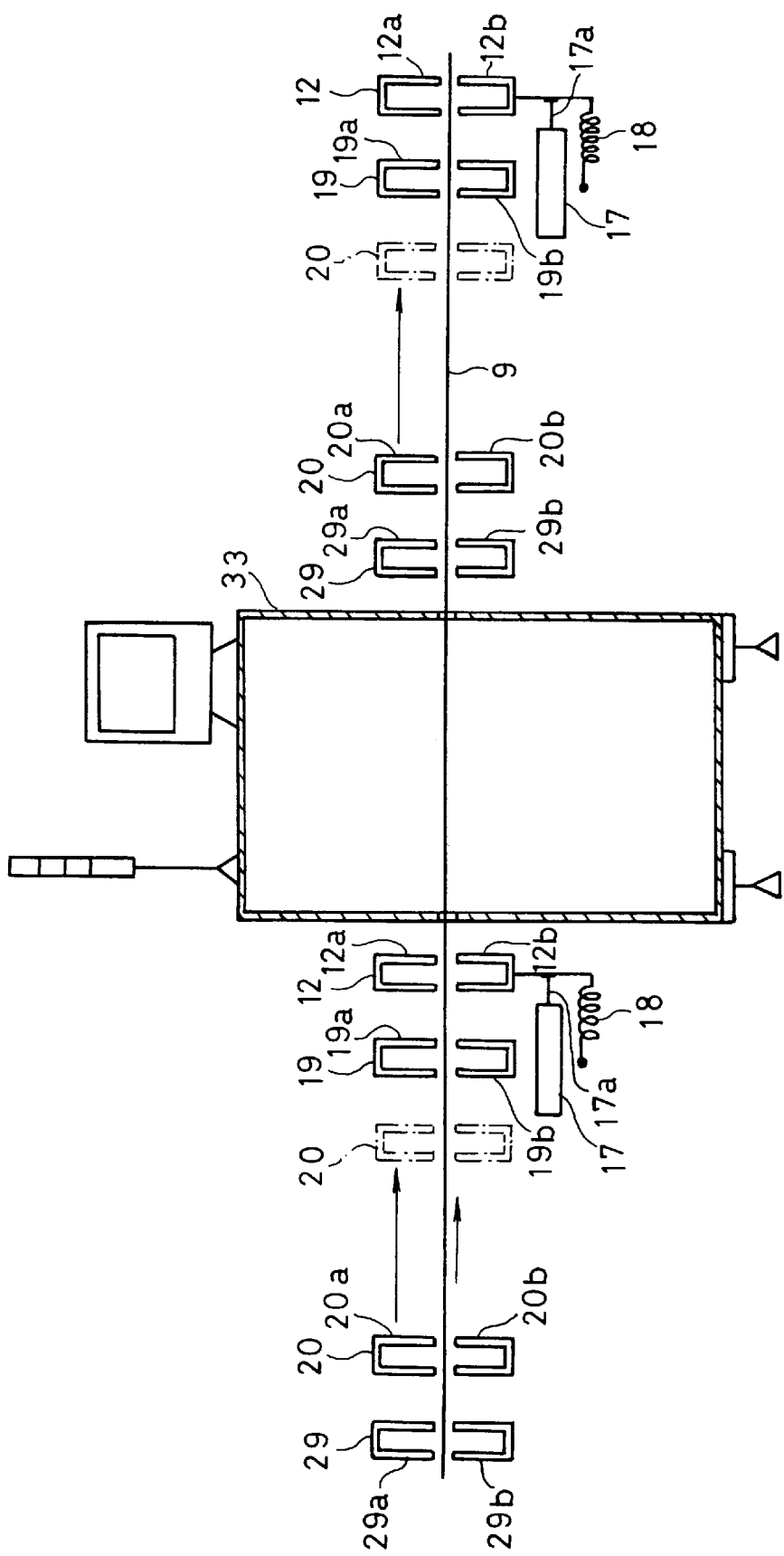
FIG. 7 is a schematic view of an arrangement and an operation of a tension apparatus in accordance with the present invention.

FIG. 1 is a front view, FIG. 2 is a front view of a main portion in a partly omitting manner, FIG. 3 is a plan view of a main portion in a partly omitting manner, FIG. 4 is an enlarged cross sectional view along a line A—A in FIG. 2, FIG. 5 is an enlarged cross sectional view along a line B—B in FIG. 2, FIG. 6 is an enlarged view of a portion C in FIG. 4, and FIG. 7 is a schematic view of an arrangement and an operation of an apparatus.

The present invention is structured such as to employ a pair of tension apparatuses which have the same structure, however, the following description will be given of only one set of the tension apparatus.

In the drawings, reference numeral 1 denotes a frame-like supporting table. The frame-like supporting table 1 is mounted to an upper portion of a base table 2 in such a manner as to move upward and downward at a suitable timing. Further, reference numerals 3 and 3 denote guide rods which are suspended to a lower portion of the frame-like supporting table 1, reference numerals 4 and 4 denote guide sleeves which are slidably fitted to the guide rods 3 and 3 and are provided in the base table 2, reference numeral 15 denotes an elevating operation rod which is suspended to the lower portion of the frame-like supporting table 1, and reference numeral 6 denotes a guide sleeve which is slidably fitted to the elevating operation rod 5 and is provided in the base table 2. Further, reference numeral 7 denotes a cam which is provided in the base table 2 and rotates in a vertical direction, and reference numeral 8 denotes an operation rod which is connected to a lower end portion of the elevating operation rod 5 and is swung in a vertical direction on the basis of a rotation of the cam 7.

Reference numeral 9 denotes a film-like printing body, and denotes a film-like printed circuit board in the present embodiment. Reference numerals 10 and 10 denote rotating rolls which are arranged along a moving direction of the film-like printing body 9 and receive the film-like printing body. The rotating rolls 10 and 10 are rotatably pivoted to the upper surface of the frame-like supporting table 1 through supporting rods 11 and 11.

References 12 and 12 denote tension clamps which clamp both end portions of the film-like printing body 9 in the width direction at a suitable timing. The tension clamps 12 and 12 are constituted by a pair of upper and lower clamp bodies 12a and 12b. Further, the tension clamps 12 and 12 are arranged in a front end side in the moving direction of the film-like printing body 9 on an upper surface of the frame-like supporting table 1, and is mounted so as to move along the moving direction of the film-like printing body 9.

Reference numerals 13 and 13 denote guide rails which are provided on the upper surface of the frame-like supporting table 1 along the moving direction of the film-like printing body 9, and reference numerals 14 and 14 denote supporting bodies for the tension clamps 12 and 12. The supporting bodies 14 and 14 are respectively mounted so as to freely slide along the guide rails 13 and 13. Further, the supporting bodies 14 and 14 for the tension clamps are structured such as to be simultaneously moved through suspended connection plates 15 and 15 and a connection rod 16 which connects the connection plates 15 and 15.

Reference numeral 17 denotes a cylinder which pushes the tension clamps 12 and 12 to a forward side in the moving direction of the film-like printing body 9 by a predetermined stroke. The cylinder 17 is fixed to the frame-like supporting table 1 along the moving direction of the film-like printing body 9. In this case, in the present embodiment, a piston rod 17a of the cylinder 17 is structured such as to be brought into contact with the connection rod 16 and be retracted after pushing out the tension clamps 12 and 12 so as to be moved apart from the connection rod 16.

Reference numeral 18 denotes a tension coil spring having a suitable elasticity. The tension coil spring 18 energizes the tension clamps 12 and 12 pushed out by the cylinder 17 in a pulling back direction. In this case, the tension coil spring 18 is provided between the connection rod 16 and the frame-like supporting table 1, in the present embodiment.

Reference numerals 19 and 19 denote fixing clamps which are arranged in a rear side of the tension clamps 12 and 12 in the moving direction of the film-like printing body 9 on the upper surface of the frame-like supporting table 1 so as to be close to the tension clamps 12 and 12. Further, the fixing clamps 19 and 19 are respectively constituted by a pair of upper and lower clamp bodies 19a and 19b, and are structured such as to clamp both end portions of the film-like printing body 9 in the width direction at a suitable timing.

Reference numerals 20 and 20 denote feeding clamps which are respectively constituted by a pair of upper and lower clamp bodies 20a and 20b. The feeding clamps 20 and 20 clamp both end portions of the film-like printing body 9 in the width direction at a suitable timing, and are structured such as to feed out the processed film-like printing body by a predetermined stroke. Further, the feeding clamps 20 and 20 are arranged in a rear end side in the moving direction of the film-like printing body 9 on the upper surface of the frame-like supporting table 1, and are mounted so as to move along the moving direction of the film-like printing body 9.

Reference numerals 21 and 21 denote guide rails which are provided on the upper surface of the frame-like supporting table 1 along the moving direction of the film-like printing body 9, and reference numerals 22 and 22 denote supporting bodies for the feeding clamps 20 and 20. The supporting bodies 22 and 22 are respectively mounted so as to freely slide along the guide rails 21 and 21. Further, the supporting bodies 22 and 22 for the feeding clamps are structured such as to be simultaneously moved through connection plates 23 and 23 respectively suspended thereto, and a connection rod 24 and a connection plate 25 which connect the connection plates 23 and 23.

Reference numeral 26 denotes a screw shaft which moves the feeding clamps 20 and 20 at a predetermined timing, in a predetermined direction and by a predetermined stroke along the moving direction of the film-like printing body 9. Further, the screw shaft 26 is arranged along the moving direction of the film-like printing body 9, is engaged with a screw hole 27 provided in the connection plate 25, and is connected to a rotating shaft of a drive motor 28 which is fixed to the frame-like supporting table 1.

Reference numerals 29 and 29 denote fixing clamps which are arranged in a rear side of the feeding clamps 20 and 20 in the moving direction of the film-like printing body 9 on the upper surface of the frame-like supporting table 1 so as to be close to the feeding clamps 20 and 20. Further, the fixing clamps 29 and 29 are respectively constituted by a pair of upper and lower clamp bodies 29a and 29b, and are structured such as to clamp both end portions of the film-like printing body 9 in the width direction. Further, in the drawings, reference numerals 30, 30, 31 and 31 denote stoppers which respectively restrict the stroke, and reference numerals 32 and 32 denote restriction rods for preventing the film-like printing body from being floated up, and reference numeral 33 denotes a parts mounting apparatus.

Next, a description will be given of an operation of the present embodiment.

First of all, a description will be given of a case that the tension is applied to the film-like printing body 9. As shown in FIG. 7, two sets of the present tension apparatuses are arranged at both side of the parts mounting apparatus 33. First of all, the fixing clamps 19 and 29 at the right side of the parts mounting apparatus 33 in the drawing and the fixing clamps 19 and 29 at the left side of the parts mounting apparatus 33 in the drawing clamp the film printing body 9. Next, in this state, the tension clamps 12 and 12 at the left side of the parts mounting apparatus 33 in the drawing are pushed out by a predetermined stroke in the moving direction of the film-like printing body 9 by using the cylinder 17. In this case, when this operation is finished, the piston rod of the cylinder 17 is retracted. The pushed out tension clamps 12 and 12 clamp the film-like printing body 9 and are pulled back by the tension coil spring 18. Accordingly, a part of the film-like printing body 9 within the parts mounting apparatus 33 is pulled in a length direction, and a suitable tension is applied on the basis of an elastic operation of the tension coil spring 18.

Next, a description will be given of feeding of the film-like printing body.

When the parts mounting is finished in a state in which a suitable tension is applied in the manner mentioned above, the tension clamps 12 and 12 by which the tension is applied stop the clamping operation and return to the original positions. Next, the feeding clamps 20 and 20 at the right side and the left side of the parts mounting apparatus 33 in the drawing simultaneously clamp the film-like printing body 9. Further, at the same time, the fixing clamps 19 and 29 at the right side of the parts mounting apparatus 33 in the drawing and the fixing clamps 19 and 29 at the left side of the parts mounting apparatus 33 in the drawing stop the clamping operation of the film-like printing body 9. Further, thereafter, the feeding clamps 20 and 20 move on the basis of the operation of the screw shaft 26 so as to move the film-like printing body 9 by the predetermined stroke in the moving direction thereof. Further, thereafter, the fixing clamps 19, 19, 29 and 29 again clamp the film-like printing body 9, and at the same time, the feeding clamps 20 and 20 stop the clamping operation and return to the original positions. In accordance with the manner mentioned above, all the steps are completed.

Since the present invention has the structure and the operation mentioned above, it is possible to apply a suitable tension to the film-like printing body to be processed in the printing step or the parts mounting step. Accordingly, it is possible to solve the whole of the problems in the conventional art. In addition, it is possible to automatically feed out the processed film-like printing body by the predetermined stroke, and it is possible to improve an operation efficiency of a whole in the continuous printing and mounting apparatus.

What is claimed is:

1. A tension apparatus in a continuous printing and mounting apparatus for a film-like printing body constituted by a pair of tension apparatuses, each of the tension apparatus comprising:

a frame-like supporting table which is mounted to an upper portion of a base table so as to move upward and downward at a suitable timing;

a tension clamp which is arranged in a front end side in a moving direction of the film-like printing body on an upper surface of the frame-like supporting table, is mounted so as to move along the moving direction of the film-like printing body, and clamps both end portions of the film-like printing body in a width direction at a suitable timing;

a suitable pushing means for pushing the tension clamp to a front side in the moving direction of the film-like printing body by a predetermined stroke;

a tension coil spring which energizes the tension clamp pushed by a cylinder in a direction of pulling back the tension clamp and has a suitable elasticity;

a fixing clamp which is arranged in a rear side of the tension clamp in the moving direction of the film-like printing body on the upper surface of the frame-like supporting table so as to be close to the tension clamp and clamps both end portions of the film-like printing body in the width direction at a suitable timing;

a feeding clamp which is arranged in a rear end side in the moving direction of the film-like printing body on the upper surface of the frame-like supporting table, is mounted so as to move along the moving direction of the film-like printing body, clamps both end portions of the film-like printing body in the width direction at a suitable timing and feeds out the processed film-like printing body by a predetermined stroke;

a suitable moving means for moving the feeding clamp at a predetermined timing, in a predetermined direction, and by a predetermined stroke along the moving direction of the film-like printing body; and a fixing clamp which is arranged in a rear side of the feeding clamp in the moving direction of the film-like printing body on the upper surface of the frame-like supporting table so as to be close to the feeding clamp, and clamps both end portions of the film-like printing body in the width direction at a suitable timing.

2. A tension apparatus in a continuous printing and mounting apparatus for a film-like printing body as claimed in claim 1, wherein the pushing means for the tension clamp is a cylinder which is fixed to the frame-like supporting table along the moving direction of the film-like printing body.

3. A tension apparatus in a continuous printing and mounting apparatus for a film-like printing body as claimed in claim 1 or 2, wherein the moving means for the feeding clamp is a moving means constituted by a screw shaft which is arranged along the moving direction of the film-like printing body, a connection plate which is connected to a supporting body of the feeding clamp provided with a screw hole engaging with the screw shaft, and a drive motor which is fixed to the frame-like supporting table and connected to the screw shaft.

* * * * *